(12) United States Patent
Ohta et al.

(10) Patent No.: US 6,689,641 B2
(45) Date of Patent: Feb. 10, 2004

(54) WIRING BOARD AND METHOD OF PRODUCING WIRING BOARD

(75) Inventors: Sumio Ohta, Kasugai (JP); Yasuo Doi, Nakata-gun (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/983,464

(22) Filed: Oct. 24, 2001

(65) Prior Publication Data

US 2002/0066595 A1 Jun. 6, 2002

(30) Foreign Application Priority Data

Oct. 24, 2000 (JP) .................................... P.2000-323887

(51) Int. Cl.$^7$ .............................................. H01L 21/50
(52) U.S. Cl. ...................................................... 438/121
(58) Field of Search ................................. 438/121, 675, 438/666, 114, 113, 206; 257/741, 737, 738, 781, 779, 792

(56) References Cited

U.S. PATENT DOCUMENTS 6,261,671 B1 * 7/2001 Asai et al. ................. 428/206

FOREIGN PATENT DOCUMENTS

| JP | 7-79078 | 3/1995 |
| JP | 10-256735 | 9/1998 |
| JP | 10-256736 | 9/1998 |
| JP | 11-26937 | 1/1999 |
| JP | 11-298141 | 10/1999 |

* cited by examiner

Primary Examiner—Long Pham
Assistant Examiner—Hoa B. Trinh
(74) Attorney, Agent, or Firm—Sughrue Mion, PLLC

(57) ABSTRACT

The wiring board 1 is provided with the first resin insulating layer 7, the first filled via 19 penetrating it and filled and formed by the plating, and the second conductor layer 29 formed by the plating on them. In them, the second conductor layer 29 comprises the first resin insulating layer 7, the electroless plating layer 33 formed on the first filled via 19, and the electrolytic plating layer 37 composed of plating particle of substantially uniform size, formed thereon.

13 Claims, 12 Drawing Sheets

WIRING BOARD AND METHOD OF PRODUCING WIRING BOARD

BACKGROUND OF THE INVENTION

1. Field of the Invention

The present invention relates to a wiring board having the resin insulating layer, a via penetrating the insulating layer, and a conductor layer formed on the resin insulating layer and via, and a method of producing the wiring board, and specifically to a wiring board in which the via and conductor layer is formed of the plating, and the via is a filled via which is filled with the plating, and a method of producing the wiring board.

2. Description of the Related Art

Conventionally, the wiring board in which a filled via penetrating the approximately plate-shaped resin insulating layer is filled with the plating and formed, and the conductor layer is formed thereon by the plating, is well known. For example, in FIG. 9, a wiring board 101 showing a partially enlarged sectional view of a main surface 102 side is shown. An approximately plate-shaped core board 103 is provided at the center of the wiring board 101. The first resin insulating layer 105 is laminated on both surfaces of the core board 103, and further, the second resin insulating layer 107 is laminated thereon. Further, on the second resin insulating layer 107, a solder resist layer (resin insulating layer) 109 is laminated.

In them, on the core board 103, a plurality of approximately cylindrical throughhole conductors 111 penetrating the core board, are formed at predetermined positions. Further, in the first resin insulating layer 105, a plurality of throughholes 113 for the first via penetrating the insulating layer are formed at the predetermined positions, and in each of the throughholes 113, the first filled via 115 is filled and formed by the plating. In the same manner, in the second resin insulating layer 107, a plurality of through holes 117 for the second via are formed at the predetermined positions, and in each of throughholes 117 for the second via, the second filled via 119 is formed. Further, in the solder resist layer 109, a plurality of openings 121 penetrating the resist layer, are formed at the predetermined positions in order to expose pads respectively.

The first conductor layer 123 of a predetermined pattern of the wiring or pad is formed between the core board 103 and the first resin insulating layer 105, and connected to the throughhole 111 of the core board 103 or the first filled via 115 of the first insulating layer 105. Further, also between the first resin insulating layer 105 and the second resin insulating layer 107, the second conductor layer 125 of a predetermined pattern of the wiring 126 or pad 124 is formed, and is connected to the first filled via 115 of the first resin insulating layer 105 or the second filled via 119 of the second resin insulating layer 107. Further, also between the second resin insulating layer 107 and the solder resist layer 109, the third conductor layer 127 of a predetermined pattern of the wiring or pad 128 is formed, and is connected to the second filled via 119 of the second resin insulating layer 107. Then, a portion of the pad 128 of the third conductor layer 127 is exposed in the opening 121 for the pad of the solder resist layer 109, to mount the electronic parts onto the wiring board 101.

In such the wiring boards, the first filled via 115 of the inside or the surface of the first resin insulating layer 105 and the second conductor layer 125 are formed as follows. That is, initially, by the publicly known method, the throughhole conductor 111 is formed in the core board 103, and the first conductor layer 123 is formed on the core board 103, and further, the board 131 formed thereon the first resin insulating layer 105 having the throughhole 113 for the first via, is prepared (refer to FIG. 10).

Next, the electroless plating is conducted on the board 131, and the electroless plating layer shown by a bold line in the drawing is formed on the surface of the first resin insulating layer 105 and in the throughhole 113 for the first via. Then, the plating resist layer 133 of a predetermined pattern is formed on the electroless plating layer (refer to FIG. 10). After that, by using the plating liquid having the character in which, when the plating is conducted on a portion including the hole, the plating is more grown in the hole than the outside of the hole (hereinafter, in the present specification, the plating liquid having such the characteristic is also called the plating liquid for the filled via), the electrolytic plating is conducted on the board 131. Then, as shown in FIG. 10, the plating is filled in the throughhole 113 for the first via and the first filled via 115 is formed, and the electrolytic plating layer is formed on the first filled via 115 and the electroless plating layer of the first resin insulating layer 105.

In this connection, in the plating liquid for the filled via, in order to promote the plating growth in the hole and to inhibit the plating growth outside the hole, a leveling agent (plating inhibitor) such as N series high polymer is normally included. After, the electrolytic plating, the plating resist layer 133 is removed, and when the electroless plating layer covered by the plating resist layer 133 is removed by the etching, the second conductor layer 125 of the predetermined pattern is formed. In this manner, the first filled via 115 and the second conductor layer 125 are formed on the first resin insulating layer 105.

After that, on the first resin insulating layer 105 and the second conductor layer 125, the second resin insulating layer 107 is laminated, and in the same manner as described above, the second filled via 119 and the third conductor layer 127 are newly formed. Then, on the second resin insulating layer 107 and the third conductor layer 127, when the solder resist layer 109 having the opening 121 for the pad is formed, the wiring board 101 shown in FIG. 9 is produced.

However, when, by using the plating liquid for the filled via, the first filled via 115 and the second conductor layer 125 are formed, because the condition of the second conductor layer 125 is different depending on the position in the board 131, the disadvantage occurs. This is considered that it is influenced from the reason that, at the time of the electrolytic plating, the current density is biased in the board 131.

Relating to this disadvantage, when the description is specifically conducted on the board 131 shown in FIG. 10, in a portion in which the arrangement of the formed wiring 126 or pad 124 is coarse, that is, in a portion in which the pattern of the plating resist layer 133 is coarse, (a left side portion in the drawing), the current density becomes high at the time of the electrolytic planing, and the leveling agent in the plating liquid is easily attracted in this portion. When the vicinity of the first filled via 115L existing in the left side portion in FIG. 10 and a pad 124L of the second conductor layer 125 is observed, as a partially enlarged sectional view is shown in FIG. 11, the growth of the plating particle is inhibited in the pad 124L, as the result, the thickness of the plating layer (the thickness of the pad 124L, that is, the second conductor layer 125) becomes also comparatively thin. Further, as the result that the growth of the plating particle is inhibited, there is a case where an area in which the plating particle with extremely small particle diameter partly exists, is generated. In contrast to this, in a portion in which the arrangement of the wiring 126 or the pad 126 is dense, that is, in a portion in which the pattern of the plating resist layer 133 is dense, (a right side portion in the drawing), the current density at the time of the electrolytic plating is lowered, and the leveling agent in the plating solution is hardly attracted. Therefore, when the vicinity of the wiring 126R of the second conductor layer 125 existing in the right side portion in FIG. 10 is observed, as the partially enlarged sectional view is shown in FIG. 12, the plating particle grows comparatively large and the thickness of the plating layer (the wiring 126R, that is, the thickness of the second conductor layer 125) becomes comparatively thick.

Further, when only the pad 124 or the wiring 126 is observed, because the plating resist layer 133 has the characteristic by which the leveling agent is hardly attracted, as shown in FIG. 11 and FIG. 12, in its vicinity, the leveling agent is hardly collected, the plating particle grows comparatively large, and the thickness of the plating layer also becomes comparatively thick. On the one hand, because a portion apart from the plating resist layer 133 (central portion) easily attracts the leveling agent, the growth of the plating layer is inhibited, and the thickness of the plating layer also becomes comparatively thin. As the result, in the pad 124L shown in FIG. 11, the peripheral portion becomes the shape in which the portion is leaped up from the central portion. Further, also in the wiring 126R shown in FIG. 12, its both edge portions become the shape in which the portions are leaped up from the central portion.

Further, in the board 131, in the vicinity (not shown) of the connection point to the electrode of the electrolytic plating, because the current density becomes relatively high, and the leveling agent is easily attracted, the growth of the plating particle is inhibited, and the thickness the of plating layer also becomes comparatively thin, however, at the portion apart from the connection point of the electrode, because the current density becomes low, and the leveling agent is hardly attracted, the plating particle is grown, and the thickness of the plating layer also becomes comparatively thick.

As described above, because the conductor layer (the second conductor layer 125) becomes thick and thin depending on the position, or becomes the shape in which it is leaped up at the peripheral portion of the pad 124 or at both edge portions of the wiring 126, the conductor layer has a poor appearance. In the same manner, this can be said also for the third conductor layer 127.

Further, before the second resin insulating layer 107 is laminated on the second conductor layer 125, or before the solder resist layer 109 is laminated on the third conductor layer 127, when the surface of the second conductor layer 125 or the third conductor layer 127 is subjected to surface roughening by etching, the roughening unevenness is generated due to the non-uniformity of the distribution of the plating particle of the surfaces of the first and the second conductor layers 125 and 127, and the poor appearance is generated. Further, in a portion in which minute plating particles of, for example, 0.1 $\mu$m are collected, the fine roughened surface is not formed, and there is case where the close contact intensity of the second conductor layer 125 with the second resin insulating layer 107, or the close contact intensity of the third conductor layer 127 with the solder resist layer 109 is lowered.

Further, for example, in the peripheral portion which is leaped up convex-shaped in the second conductor layer 125 surrounded by the dashed line in FIG. 9, the insulation space to the third conductor layer 127 formed on the second resin insulating layer 107 through the layer 107, is reduced, and there is also a case where the electric fault such as the short circuit occurs between the upper and lower conductor layers.

SUMMARY OF THE INVENTION

In view of such the actual condition, the present invention is attained, and an object is to provide a wiring board and a method of producing the wiring board, in which, in the wiring board having a resin insulating layer, filled via which penetrates the insulating layer and which is filled and formed by the plating, and the conductor layer formed by the plating on them, the thickness of the conductor layer is substantially uniform.

The means for solving the problems is a wiring board which comprises: a resin insulating layer; a filled via which is filled and formed by the plating in the throughhole penetrating the resin insulating layer; and a conductor layer formed by the plating on the resin insulating layer and the filled via, wherein the conductor layer is provided with an electroless plating layer formed on the resin insulating layer and filled via, and an electrolytic plating layer formed on the electroless plating layer, and the particle size distribution of the plating particle is substantially uniform without depending on the position.

As described above, in the wiring board in which the filled via is filled and formed by the plating, because the plating growth is different depending on the position, the variation is easily caused in the thickness of the conductor layer. However, in the present invention, the conductor layer has a very thin electroless plating layer which is formed on the resin insulating layer and the filled via, and the electrolytic plating layer which is formed on the electroless plating layer and in which the particle size distribution of the plating particle is substantially uniform. This electrolytic plating layer can be said, because the particle size distribution is substantially uniform without depending on the position, that it is grown at substantially the same speed without depending on the position, and the thickness is substantially the same without depending on the position. Accordingly, also as the whole conductor layer including the electroless plating layer, the thickness is substantially uniform, and the appearance is good.

In the present application, the particle size distribution was observed with SEM or FE-SEM. The particle size was observed by cross sectional SEM photographs.

Further, in the above wiring board, the conductor layer surface is made a surface roughened by etching, and it is better when a wiring board has the upper resin insulating layer on the conductor layer and the resin insulating layer.

In the case where the particle size distribution of the plating particle (the plating particle of the electrolytic plating layer) is substantially uniform, when the conductor layer surface is made rough surface by the etching, the conductor layer surface is uniformly made rough surface without unevenness. Accordingly, in the wiring board of the present invention, because the conductor layer surface is made substantially uniform roughened surface, there is no unevenness in the close contact strength between the conductor layer and the upper resin insulating layer formed thereon.

In this case, the particle size of the plating of the electrolytic plating layer is preferable when it is not smaller than about 1 $\mu$m. It is for the reason that, because there is no uneveness in the close contact strength between the conductor layer and the upper resin insulating layer (there is no uneven portion in which the plating particle of particle size of not larger than 0.1 μm is unevenly distributed), and the surface roughness of the roughened surface can be increased, these close contact strength can also be increased.

Further, other resolving means is the wiring board having the resin insulating layer and the filled via filled and formed in the throughhole penetrating the resin insulating layer by the plating, and the conductor layer which is formed by the plating on the resin insulating layer and the filled via, and the conductor layer is the wiring board having the electroless plating layer formed on the resin insulating layer and the filled via, and the electrolytic plating layer of substantially uniform thickness formed on the electroless plating layer.

In the wiring board in which the filled via is filled and formed by the plating, because the plating growth is different depending on the position, the variation is easily generated in the thickness of the conductor layer. However, in the present invention, the conductor layer is composed of the very thin electroless plating layer formed on the resin insulating layer and filled via, and the electrolytic plating layer with substantially uniform thickness formed on the electroless plating layer. Accordingly, as the whole conductor layer, the thickness is substantially uniform and the appearance is good.

Further, in the above wiring board, in the electrolytic plating layer, the particle size distribution of the plating particle is substantially uniform without depending on the position, and the conductor layer surface is a surface roughened by etching, and it is better that the wiring board has the upper resin insulating layer provided on the conductor layer and the resin insulating layer.

In the case where the particle size distribution of the plating particle (plating particle of the electrolytic plating layer) in the vicinity of the conductive layer surface is substantially uniform, when the conductor layer surface is roughened by etching, the conductor layer surface is roughened uniformly without unevenness. Accordingly, in the wiring board of the present invention, because the conductor layer surface is made roughened surface with uniform roughness, there is no uneveness in the close contact strength between the conductor layer and the upper resin insulating layer formed on the conductor layer.

In this case, it is preferable that the particle diameter of the electrolytic plating layer is not smaller than about 1 μm. this is because there is no uneveness in the close contact strength between the conductor layer and the upper resin insulating layer (there is no non-uniform portion in which the plating particle of the particle diameter of not larger than 0.1 μm is unevenly distributed), and the surface roughness of the roughened surface can be increased, therefore, the close contact strength can also be increased.

Further, it is better when the wiring board is the wiring board described in any one of the above, and it is the wiring board having the upper conductor layer on the upper resin insulating layer.

As described above, on the conductor layer, there is no spring-up on the peripheral portion of the pad or both edge portions of the wiring, and the thickness is substantially uniform. Accordingly, the insulation distance between the conductor layer and the upper conductor layer formed through the upper resin insulating layer ca be sufficiently kept, and the electric failure such as the short circuit or lowering of the insulation resistance is hardly generated.

Further, another resolution means is as follows: a method of producing the wiring board having the filled via filled and formed in the throughhole penetrating the resin insulating layer, and the conductor layer formed by the plating on the resin insulating layer and the filled via, wherein the method of producing the wiring board has: in the board having the first electroless plating layer formed in the throughhole and on the resin insulating layer, the first electrolytic plating process by which the electrolytic plating is conducted on the first electroless plating layer by the first plating liquid by which, when the plating is conducted on a portion including the hole, the plating is further grown in the hole than the outside of the hole, and the inside of the throughhole is filled with the plating and the filled via is formed, and on the substantially whole surface of the first electroless plating layer of the filled via and resin insulating layer, the first electrolytic plating layer is formed; and the plating layer remove process by which the first electroless plating layer on the first electrolytic plating layer and the resin insulating layer is removed. An example of the first electrolytic plating liquid includes Cu-Brite VF by EBARA-UDYLITE CO., LTD.

In the present invention, initially, on the electroless plating layer of the board, the filled via and the first electrolytic plating layer are formed by the first plating liquid by which the plating is further grown inside the hole than outside the hole (the first electrolytic plating process). The first plating liquid makes the growth of the plating different depending on the position, thereby, because the inside of the throughhole can be effectively filled by the plating, it is convenient for forming the filled via. Further, in this process, different from the conventional process, because the plating resist layer is not formed on the board, there is no variation of the thickness in the conductor layer, such as the difference in the thickness depending on the position or spring-up.

After the first electrolytic plating process, the first electrolytic plating layer formed on substantially whole surface and the first electroless plating layer below it (the electroless plating layer on the resin insulating layer) are removed by, for example, etching or mechanical grinding (the plating layer removal process).

In the board after the plating layer removal, because the throughhole in the resin insulating layer is filled by the plating, the surface of the resin insulating layer and the upper surface of the filled via are substantially on the same surface. That is, the surface of the board is substantially flat. On such the substantially flat board surface, the uniform thickness conductor layer can be easily formed.

Accordingly, according to the present invention, even when the filled via exists, the wiring board in which the thickness of the conductor layer is substantially uniform can be easily produced.

Further, in the method of producing the wiring board, it is better in the plating layer removal process when a resin roughening process by which, by the mechanical grinding, the first electrolytic plating layer and the first electroless plating layer on the resin insulating layer are removed, and the surface of the resin insulating layer from which the plating layer is removed, is etched and roughened, is provided.

To etch and rough the surface of the resin insulating layer is for the reason to increase the close contact strength between the resin insulating layer and the conductor layer formed thereon, and further when the resin insulating layer is laminated on the upper portion, it is for the reason to increase the close contact strength between the resin insulating layer and the upper resin insulating layer.

Conventionally, this resin roughening process is conducted after the resin insulating layer is formed, and before the electroless plating layer is formed. However, in the plating layer removal process, when the plating layer is removed by the mechanical grinding, not only the plating layer, but also the resin insulating layer below it is ground, thereby the surface roughness is sometimes reduced.

In contrast to it, in the present invention, because the resin roughening process is conducted after the plating layer removal process, the conductor layer can be formed thereon under the condition that the surface of the resin insulating layer is formed to the desired surface roughness, and further, the upper resin insulating layer can also be formed. Accordingly, the reliability of the close contact strength between: the resin insulating layer; and the conductor layer or the upper resin insulating layer can be increased.

Further, in the method of producing the wiring board described in any one of the above description, the method of producing the wiring board is better when it has: the electroless plating process to form the second electroless plating layer on substantially whole surface on the filled via and on the resin insulating layer, from which the plating layer is removed; and the second electrolytic plating process by which, in the second electroless plating layer, on a portion exposed to the outside, the electrolytic plating is conducted by the second plating liquid by which the plating is at least the same degree in the outside of the hole as in the inside of the hole, and the second electrolytic plating layer is formed.

An example of the second electrolytic plating liquid includes Curex-S by Electroplating Engineers of Japan Ltd.

In the present invention, after the plating layer removal process, or after the resin roughening process when there exists the resin roughening process, the second electroless plating layer is formed on the board surface (on the filled via and on the resin insulating layer). Next, for example, the plating resist layer of a predetermined pattern is formed on the electroless plating layer, and the electrolytic plating is conducted by the second plating liquid which has, when the plating is conducted on a portion including the hole, the characteristic by which the plating is grown to the same degree or more in the outside of the hole than in the inside the hole, on the second electroless plating layer exposed to the outside from the plating resist layer (the second electrolytic plating process). In that case, in the second plating liquid, because the plating grows substantially uniformly, the second electrolytic plating layer with substantially uniform thickness can be formed.

After that, the plating resist layer is removed, and when the second electroless plating layer covering the plating resist layer is etched and removed, the predetermined patterned conductor layer can be formed. Because this conductor layer is composed of the very thin second electroless plating layer, and the second electrolytic plating layer with substantially uniform thickness, its thickness is substantially uniform and the appearance is good.

Alternatively, after the second electroless plating layer formation, in succession, on substantially whole surface of the electroless plating layer which is exposed to the outside, the electrolytic plating by the second plating liquid may be conducted (the second electrolytic plating process). In this case also, when the second plating liquid is used, the second electrolytic plating layer with substantially uniform thickness can be formed.

After that, when a predetermined patterned etching resist layer is formed on the second electrolytic plating layer, and the second electrolytic plating layer exposed from this etching resist layer and the second electroless plating layer below it, are removed by etching, the predetermined patterned conductor layer can be formed. Because also the conductor layer produced as described above is composed of the very thin second electroless plating layer and substantially uniform second electrolytic plating layer, its thickness is substantially uniform and the appearance is good.

As described above, according to the present invention, even when the filled via exist, the conductor layer whose thickness is substantially uniform and whose appearance is good, can be formed.

Further, in the method of producing the wiring board, it is better when the method of producing the wiring board has: after the second electrolytic plating process, the roughening process to etch and roughen the conductor surface; and the upper resin layer forming process to form the upper resin insulating layer on the roughened conductor layer and the resin insulating layer.

Because the plating particle near the surface of the conductor layer before the roughening process (the plating particle of the second electrolytic plating layer) grows substantially uniformly, that is, it has substantially uniform largeness, when the surface of the conductor layer is etched and roughened in the roughening process, the surface has the roughened surface with the substantially uniform roughness. Accordingly, when the upper resin insulating layer is formed in the upper insulating layer formation process, there is no unevenness in the close contact strength between the roughened conductor layer and the upper resin insulating layer.

Further, in the method of producing the wiring board, it is better when it forms the second electrolytic plating layer formed of the plating particle larger than the particle diameter of about 1 μm in the second electrolytic plating process. The preferable upper limit of the plating particle diameter in the second electrolytic plating process is 3 μm.

When the plating particle of the second electrolytic plating layer in the vicinity of the surface of the conductor layer is very small, the roughened surface having the desired roughness can not be obtained in the roughening process, and the close contact strength between the conductor layer and the upper resin insulating layer is sometimes lowered.

In contrast to this, in the present invention, because the particle diameter of the plating particle of the second electrolytic plating layer forming the vicinity of the surface of the conductor is large, that is, lager than about 1 μm, the roughened surface with the desired roughness can be formed in the roughening process. Accordingly, the close contact strength between the conductor layer and the upper resin insulating layer can be increased.

Further, in the method of producing the wiring board described in any one of the above description, it is better when the method of producing the wiring board has the upper conductor layer forming process to form the upper conductor layer on the upper resin insulating layer.

As described above, the conductor layer does not have any variation in the thickness, and can have substantially uniform thickness. Accordingly, even when the upper insulating layer is formed thereon, and further the upper conductor layer is formed on them, there is no portion in which the insulation distance is reduced, between the conductor layer and the upper conductor layer formed through the upper resin insulating layer. Accordingly, the electric failure such as the short circuit between upper and lower conductor layers or the lowering of the insulation resistance is hardly generated.

Figure 1:
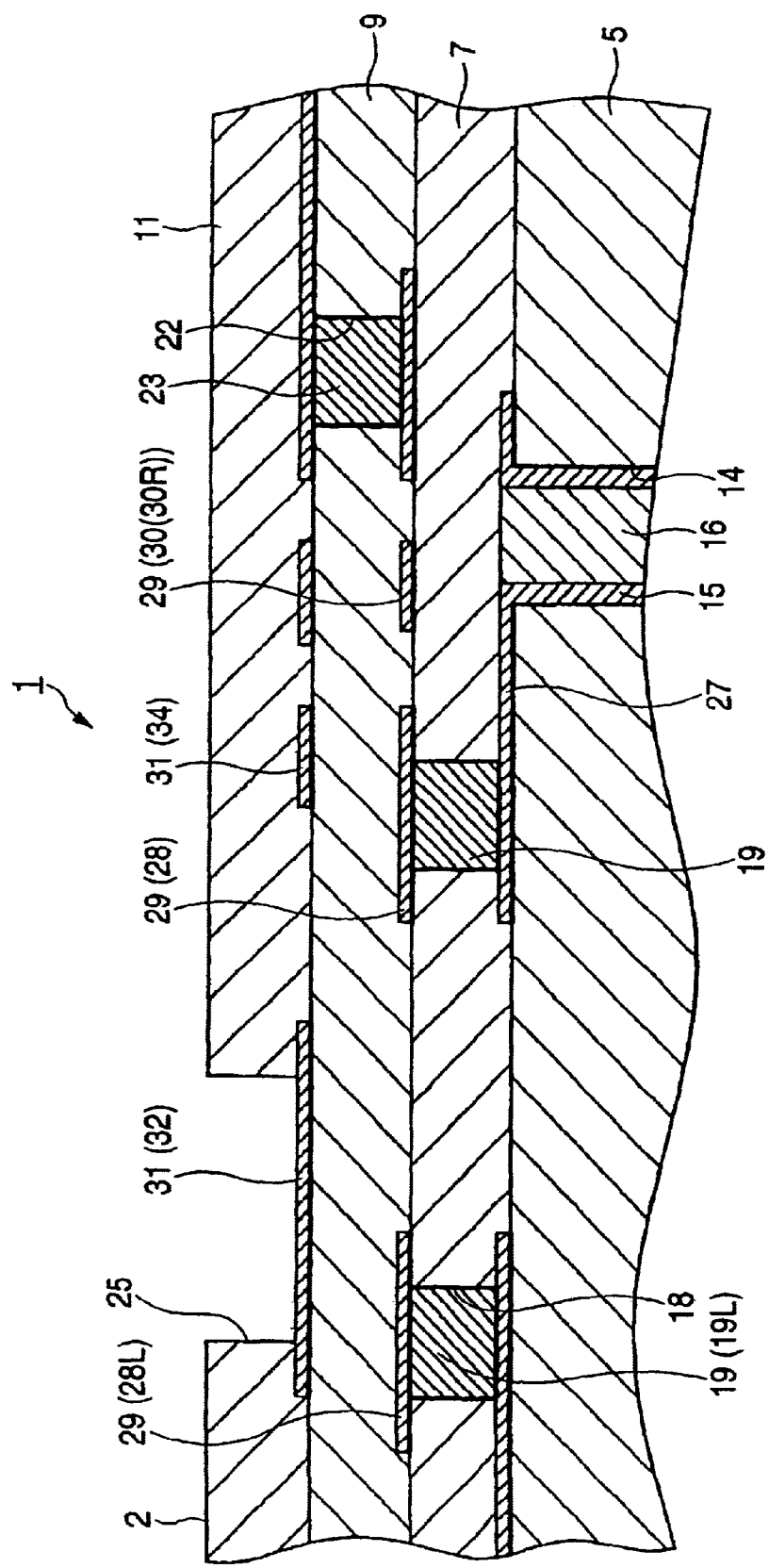
FIG. 1 is a partial enlarged sectional view of a wiring board according to the embodiment 1 shown below.

1: Wiring board
5: Core board
7: First resin insulating layer
9: Second resin insulating layer
11: Solder resist layer (resin insulating layer)
19: First filled via
23: Second filled via
27: First conductor layer
29: Second conductor layer
33: Electroless plating layer (of the second conductor layer) (Second electroless plating layer)
36: First electroless plating layer
37: Electrolytic plating layer (of the second conductor layer) (Second electrolytic plating layer)
35: First electrolytic plating layer
31: Third conductor layer
39: Electrolytic plating layer (of the third conductor layer) (Second electrolytic plating layer)

DETAILED DESCRIPTION OF THE INVENTION (Embodiment 1)

Referring to the drawings, embodiments of the present invention will be described below.

Relating to a wiring board 1 of the present embodiment, a partially enlarged sectional view of a main surface 2 side is shown in FIG. 1. This wiring board 1 is formed to a substantially plate-shaped of substantially rectangular shape having the mains surface 2 and the rear surface not shown, and in its center, a substantially plate-shaped core board 5 composed of a composite material in which epoxy resin is impregnated the glass fiber cloth is provided. Then, on its both surfaces, the first resin insulating layers 7 formed of epoxy resin are respectively laminated, and the second resin insulating layer 9 formed of the epoxy resin likewise is laminated thereon. Further, on the second resin insulating layer 9, a solder resist layer (resin insulating layer) 11 formed of epoxy resin is laminated.

In them, in the core board 5, a plurality of throughholes 14 for throughhole conductor penetrating it, are formed at a predetermined position, and in the inner peripheral surfaces of them, the substantially cylindrical throughhole conductors 15 are respectively formed. Then, in each throughhole conductor 15, a substantially cylindrical plug material 16 formed of epoxy resin is filled.

In the first resin insulating layer 7, a plurality of the throughholes 18 for the first via penetrating the layer 7, of the diameter of about 70 $\mu$m, and the height (length) of about 35 $\mu$m, are formed at a predetermined position, and in each throughhole 18 for the first via, the substantially cylindrical first filled via 19 is filled and formed by the plating.

In the same manner, in also the second resin insulating layer 9, a plurality of throughholes 22 for the second via of the diameter of about 70 $\mu$m and the height of about 35 $\mu$m, penetrating the layer 9, are formed at a predetermined position, and in the throughhole 22 for each second via, the substantially cylindrical second filled via 23 filled by the plating is for med. Further, in the solder resist layer 11, a plurality of openings 25 penetrating the layer 11, are formed at a predetermined position in order to expose the pads.

Between the core board 5 and the first resin insulating layer 7, the first conductor layer 27 of a predetermined pattern of the wiring or pad is formed, and is connected to the throughhole conductor 15 of the core board, or the first filled via 19 of the first resin insulating layer 7.

Further, also between the first resin insulating layer 7 and the second resin insulating layer 9, the second conductor layer 29 of a predetermined pattern of the wiring 30 or pad 28 is formed, and connected to the first filled via 19 of the first resin insulating layer 7 or the second filled via 23 of the second resin insulating layer 9. Further, also between the second resin insulating layer 9 and the solder resist layer 11, the third conductor layer 31 of a predetermined pattern of the wiring 34 or pad 32 is formed, and connected to the second filled via 23 of the second resin insulating layer 9. The pad 32 of a portion of the third conductor layer 31 is exposed in the opening 25 for the pad of the solder resist layer 11 to mount electronic parts such as the IC chip on this wiring board 1. In this connection, on the surface of this pad 32, a Ni plating layer is formed for the oxidation prevention, and further, an Au plating layer is formed thereon (not shown).

Figure 2:
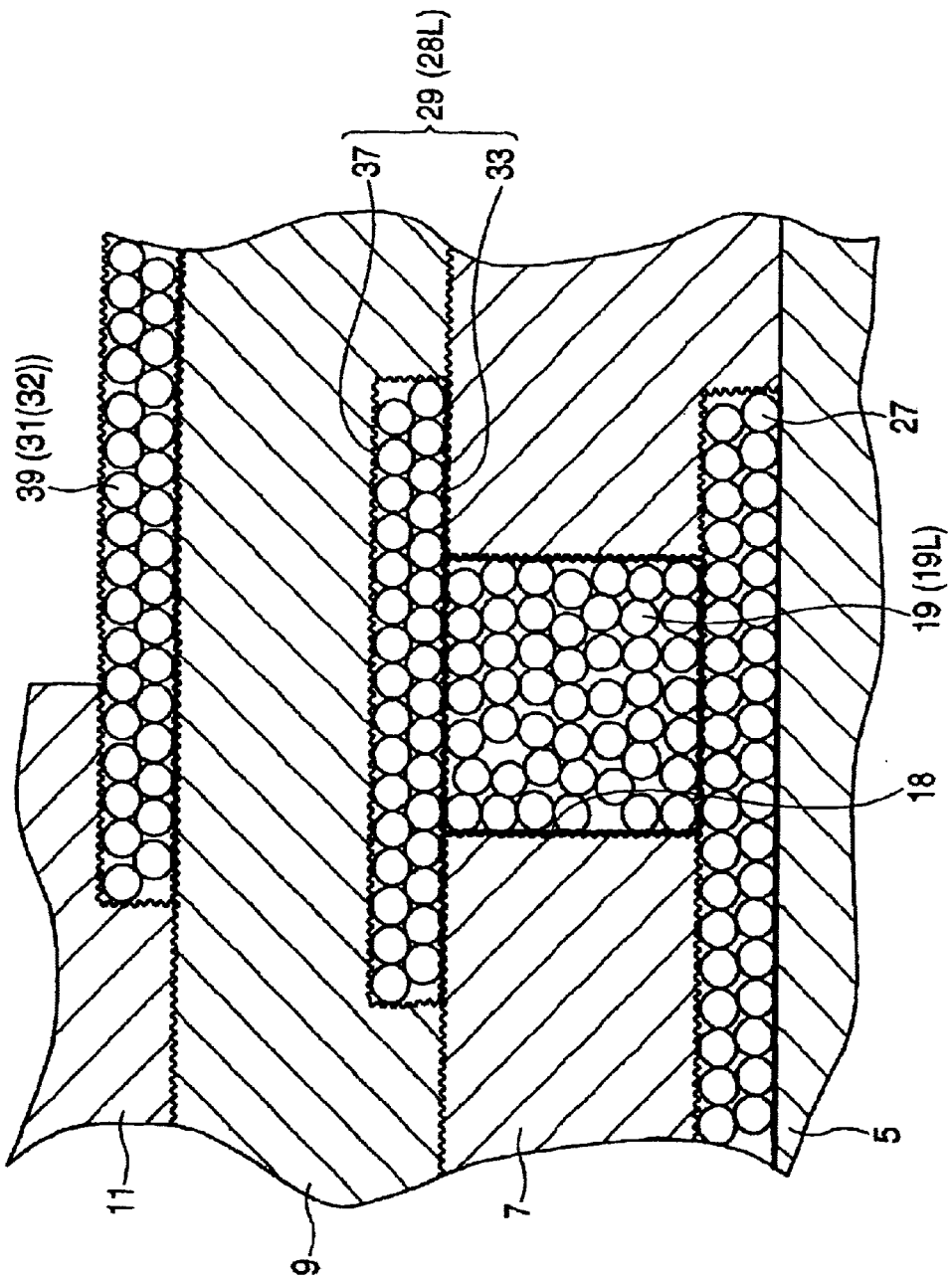
FIG. 2 is a partial enlarged sectional view in the vicinity of a filled via and a pad of the second conductor layer, in the wiring board according to the embodiment 1.
Figure 3:
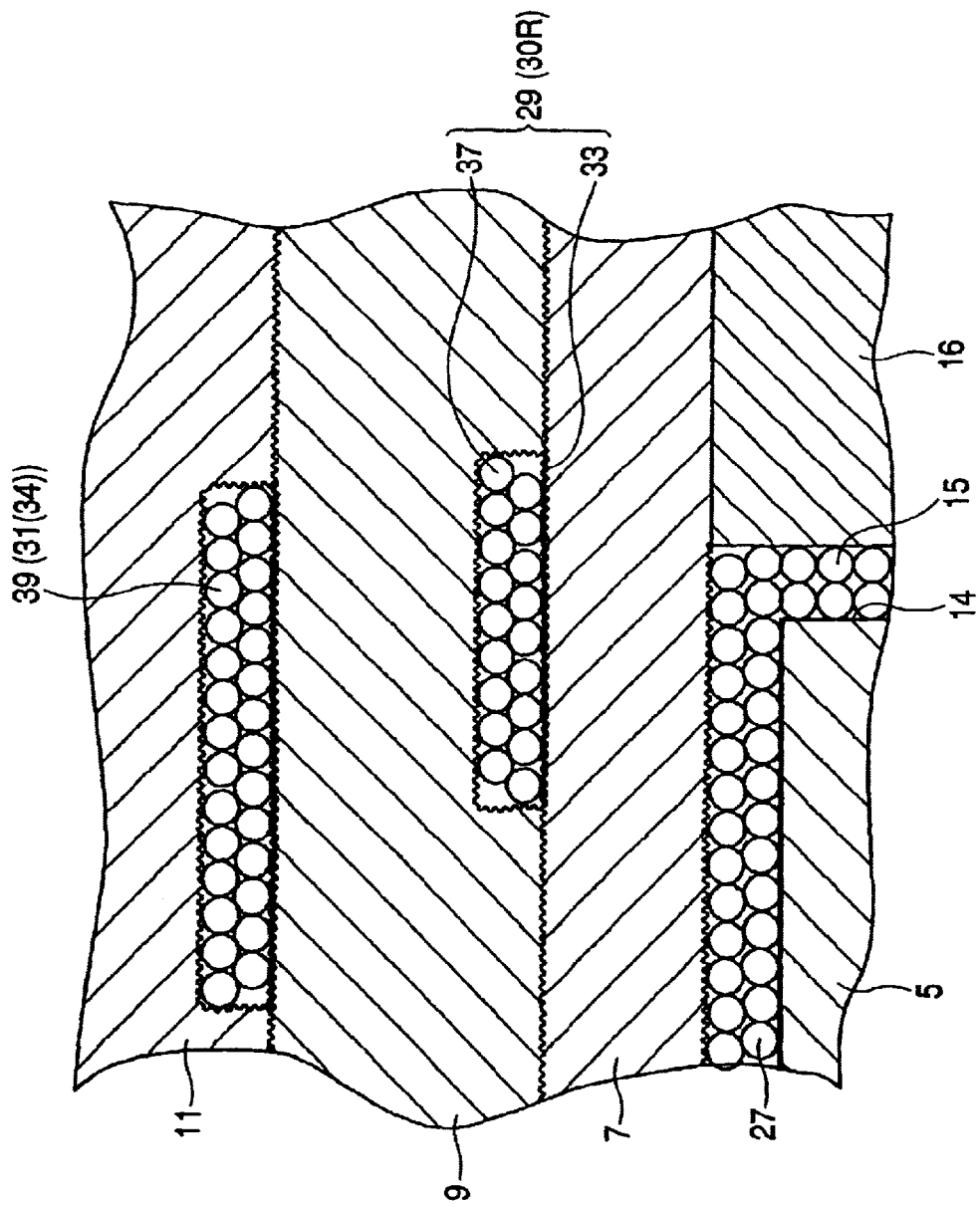
FIG. 3 is a partial enlarged sectional view in the vicinity of the wiring of the second conductor layer, in the wiring board according to the embodiment 1.

Referring to FIG. 2 and FIG. 3, the first filled via 19 of the inside of the first resin insulating layer 7 and surface, and the second conductor layer 29, in the wiring board 1, will be detailed. FIG. 2 shows the first filled via 19L shown on the left side in FIG. 1, and the vicinity of the pad 28L of the second conductor layer 29 formed thereon. The first filled via 19L is filled and formed in the first via throughhole 18 by the plating liquid for the filled via (the first plating liquid)

having the characteristic in which, the plating is conducted on a portion including the hole, the plating more grows in the inside of the hole than on the outside of the hole. Therefore, in the first via throughhole 18, the plating grows soon, and the average particle size of the plating particle is about 1–2 $\mu$m, which is comparatively large, and the particle size distribution is substantially uniform.

The pad 28L on the first filled via 19L positions in the electroless plating layer (the second electroless plating layer) 33 shown by the bold line in the drawing, and thereon, and is formed of the electrolytic plating layer (the second electrolytic plating layer) 37 formed by a conformal plating liquid (the second plating liquid) which has the characteristic in which, when the plating is conducted on a portion including the hole, the plating grows in the same degree as in the hole, or more grows outside the hole. In them, because the electrolytic plating layer 37 is formed by the conformal plating liquid, the particle diameter of the plating particle is about 1–2 $\mu$m and has substantially uniform size without depending on the position, and the particle size distribution is substantially uniform without depending on the position, and also the thickness is about 20 $\mu$m and substantially uniform. Accordingly, as it is viewed on the whole, it is different from the conventional one (refer to FIG. 11), and the thickness is substantially uniform, and the appearance is good. Specifically, in the conventional one, when the conductor layer having the thickness of about 20 $\mu$m is formed, the difference in the thickness of maximum 18 $\mu$m is generated, however, in contrast to this, in the present embodiment, the difference in the thickness is seldom generated. In this connection, the surface of the pad 28L is roughened to the surface roughness Ra of about 0.5 $\mu$m by the surface roughening by etching, for increasing the close contact strength between the second conductor layer 29 and the second resin insulating layer 9, and further, roughened substantially uniformly. It is because the whole surface of the pad 28L is structured by the plating particle which is distributed substantially uniformly.

FIG. 3 shows the vicinity of the wiring 30R of the second conductor layer 29 shown in the right side in FIG. 1. This wiring 30R has, in the same manner as the pad 28*l*, the electroless plating layer (the second electroless plating layer) 33 shown by the bold line in the drawing, and the electrolytic plating layer (the second electrolytic plating layer) 37 formed thereon of the conformal plating liquid. In them, in the electrolytic plating layer 37, in the same manner as the pad 28L, the particle diameter of the plating particle is about 1–2 $\mu$m and is of the substantially uniform size, without depending on the position, and further, the particle size distribution is substantially uniform without depending on the position, and the thickness is about 20 $\mu$m and substantially uniform. Accordingly, as it is viewed on the whole of the wiring 30R, it is different from the conventional one (refer to FIG. 12), and it has the substantially uniform thickness, and the appearance is good. In this connection, also the surface of the wiring 30R is, in the same manner as the pad 28, roughened by the surface roughening by etching, and the surface roughness Ra is about 0.5 $\mu$m, and substantially uniform.

Figure 11:
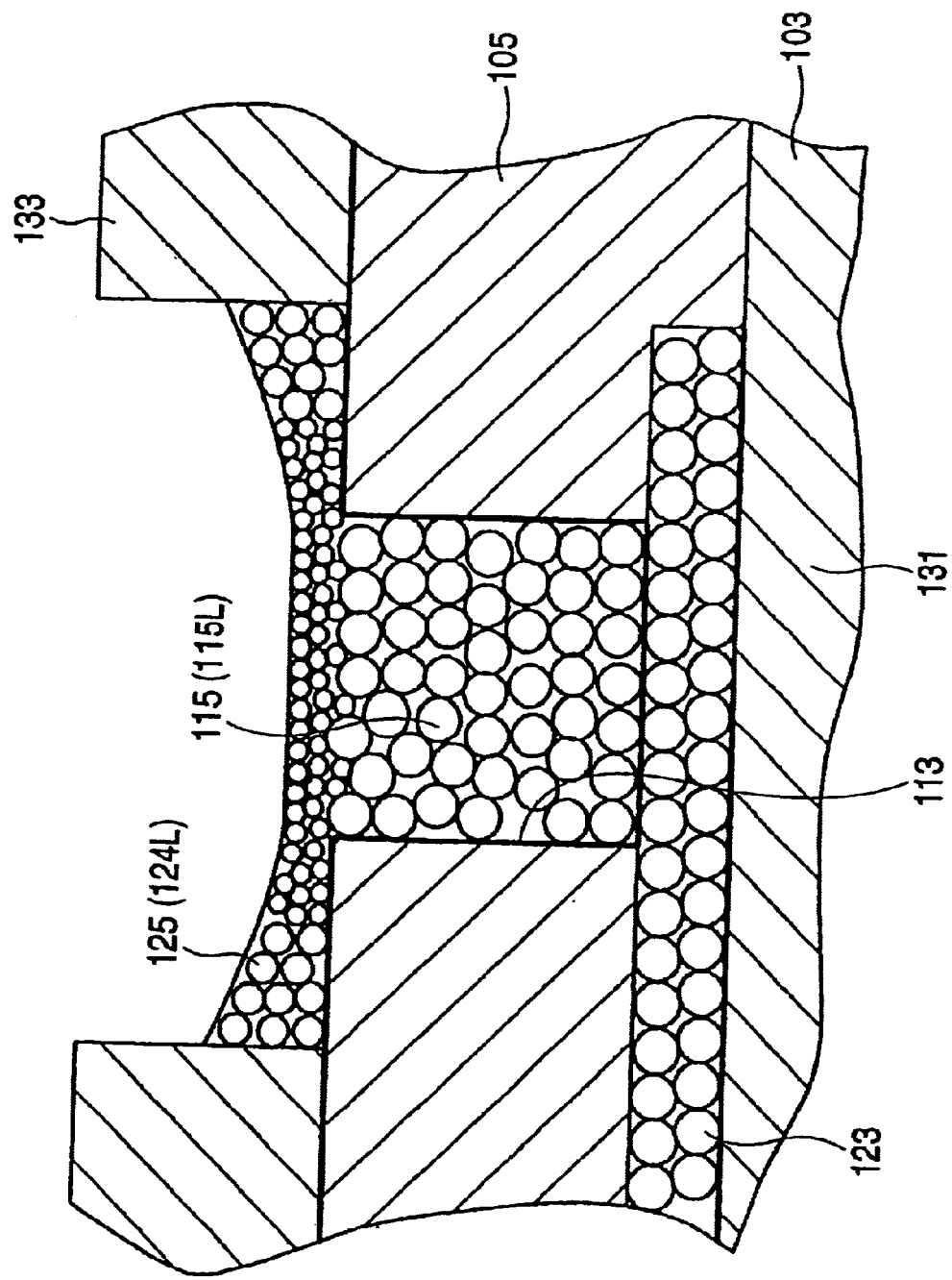
FIG. 11 relates to a method of producing the wiring board according to the conventional technology, and is a partial enlarged sectional view in the vicinity of the filled via and the pad of the second conductor layer, in the board on which the filled via and the electrolytic plating layer are formed.
Figure 12:
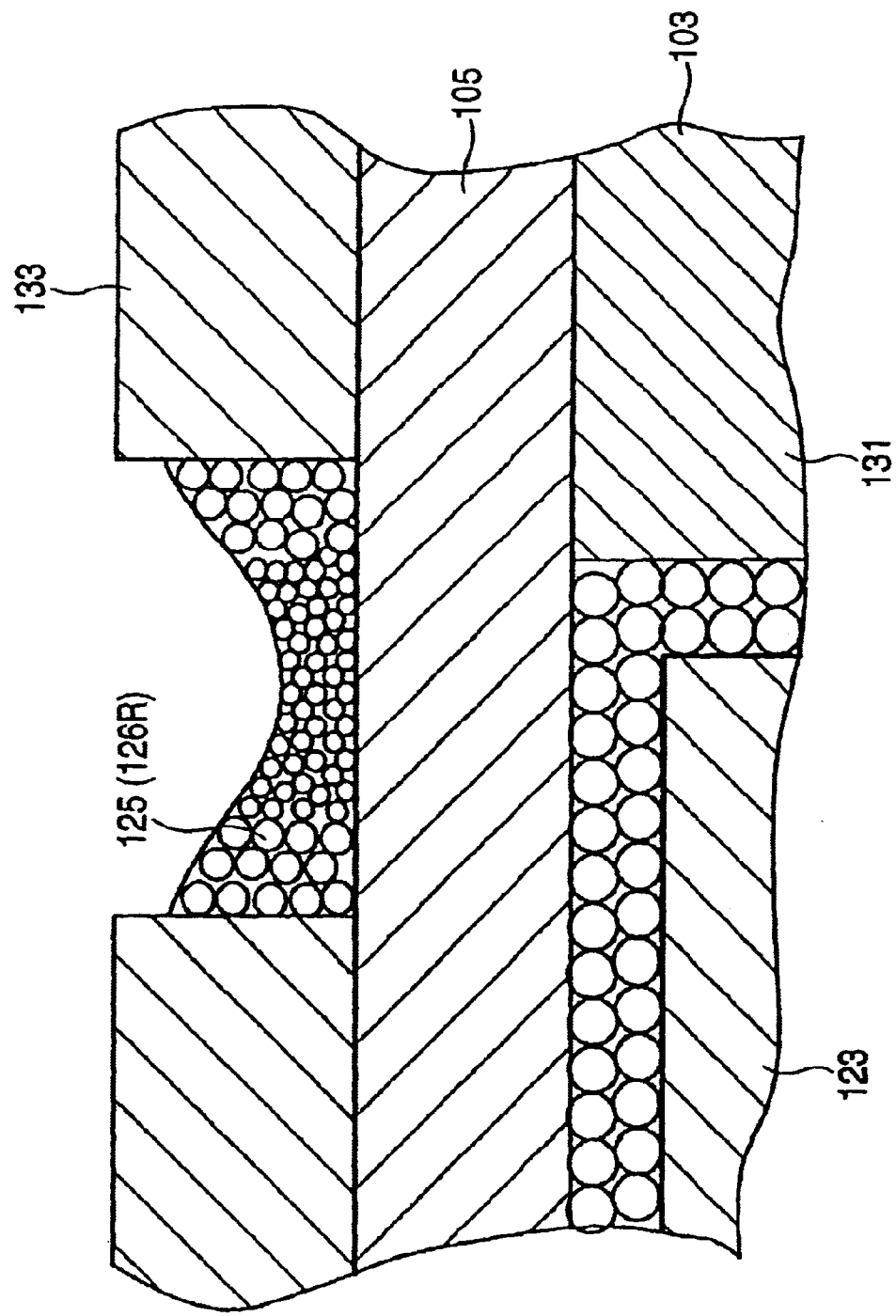
FIG. 12 relates to a method of producing the wiring board according to the conventional technology, and is a partial enlarged sectional view in the vicinity of the wiring of the second conductor layer, in the board on which the filled via and the electrolytic plating layer are formed.

Further, in the conventional wiring board 101, in the portion on which the wiring 126 or pad 124 is arranged densely, comparing to the portion on which these are arranged thinly, the growth of the plating is fast, and the thickness of the plating is also increased (refer to FIG. 11 and FIG. 12).

In contrast to that, in the wiring board 1 of the present embodiment, as the wiring 30L shown in FIG. 3, in the portion on which the wiring 30 or the pad 28 is dense, and as the pad 28R shown in FIG. 2, in the portion on which the wiring 30 or the pad 28 is thin, the electrolytic plating layer 37 is of substantially uniform thickness. Accordingly, the thickness of the second conductor layer 29, such as the wiring 30 or the pad 28, is substantially uniform without depending on the position. In this connection, although the detailed description is neglected, also for the second filled via 23 formed on the second resin insulating layer 9 and the third conductor layer 31, the same thing as the first filled via 19 and the second conductor layer 29 can be said (refer to FIG. 2 and FIG. 3).

Further, in the present embodiment, as shown in FIG. 2 and FIG. 3, the surface of the first resin insulating layer 7 and the inner peripheral surface of the first via throughhole 18 are made the surface roughened by etching having the surface roughness Rz=about 3 $\mu$m. Further, in the same manner, also the surface of the second resin insulating layer 9 and the inner peripheral surface of the second via throughhole 22 are made the surface roughened by etching having the surface roughness Rz=about 3 $\mu$m. Therefore, the close contact strength between the first resin insulating layer 7, and the second conductor layer 29 and the second resin insulating layer 9, and the close contact strength between the first resin insulating layer and the first filled via 19 are respectively high. Further, in the same manner, the close contact strength between the second resin insulating layer 9 and the third conductor layer 31 and the solder resist layer 11, and the close contact strength between the second resin insulating layer 9 and the second filled via 23 are also respectively high.

As described above, in the wiring board 1 of the present embodiment, the particle size distribution of the plating particle of the electrolytic plating layers 37 and 39, in the second and the third conductor layers 29 and 31, is substantially uniform, and the board 1 has substantially uniform thickness. Accordingly, also for the whole of the second and the third conductor layers 29 and 31 including the very thin electroless plating layer 33, the thickness is substantially uniform, and the appearance is good.

Further, although the surfaces of the second and third conductor layers 29 and 31 are roughened surfaces, the particle size distributions of the plating particles in the vicinity of the surfaces of the second and the third conductor layers 29 and 31 (electrolytic plating layers 37 and 39) are substantially uniform, therefore, the surface is uniformly roughened without unevenness. Accordingly, there is no unevenness in the close contact strength between: the second and the third conductor layers 29 and 31; and the second resin insulating layer 9 formed thereon or the solder resist layer 11. Specifically, because the size of the plating particle of the electrolytic plating layers 37 and 39 is larger than 1 $\mu$m, the surface roughness of the second and third conductor layers 29 and 31 can be increased, and the close contact strength can be increased. Further, because the thickness of the second conductor layer 29 is substantially uniform, the insulation distance between this second conductor layer 29 and the third conductor layer 31 formed through the second resin insulating layer 9, is sufficiently secured. Accordingly, the electric failure such as the short circuit between these conductor layers or the lowering of the insulation resistance is hardly generated.

Next, referring to the drawings, the method of producing the wiring board 1 will be described. Initially, the core board 5, on both sides of which, the copper foil is stuck, that is, the approximately plate shaped both side-copper-stuck core board 5, is prepared, and a plurality of throughholes 14 for the throughhole conductors are formed at the predetermined positions (refer to FIG. 4). Next, by the well known method, on substantially whole surface of the both sides of the core board 5, the plating layer is formed, and substantially cylindrical throughhole conductor 15 is formed on the inner peripheral surface of the throughholes 14 for the throughhole conductor. Then, the plug material 16 formed of epoxy resin is filled and formed in the throughhole conductor 15. After that, the etching resist layer of a predetermined pattern is formed on the plating layer, and the plating layer exposed from the resist layer is etching removed, and the first conductor layer 27 of a predetermined pattern is formed on the core board 5 (refer to FIG. 4).

Figure 4:
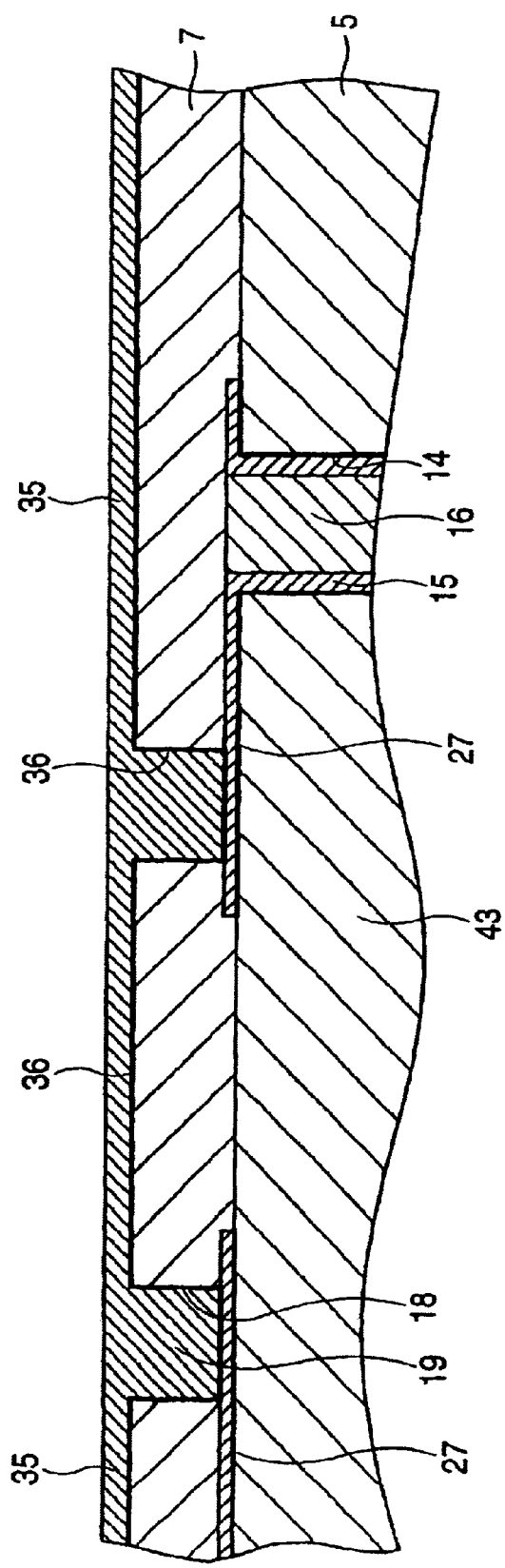
FIG. 4 relates to a method of producing the wiring board according to the embodiment 1, and is an illustration showing the condition of the board after the first electrolytic plating process.

Next, in the first insulating layer forming process, the first resin insulating layer 7 having the first via throughhole 18 is formed on the core board 5 and the first conductor layer 27 (refer to FIG. 4). Specifically, on both sides of the core board 5, sheet-shaped unhardened resin formed of photosensitive epoxy resin is laid, and heat treated and semi-hardened. After that, by using a predetermined pattern mask, the semi-hardened resin insulating layer is exposed and developed, and further, this is heated and hardened, and the first resin insulating layer 7 having the first via throughhole 18 is formed. After that, in the resin roughening process, the surface of the first resin insulating layer 7 and the inner peripheral surface of the first via throughhole 18 is etched and roughened, and the roughened surface whose surface roughness Rz of 3 $\mu$m is formed (refer to FIG. 2 and FIG. 3). Next, in the first electroless plating process, on the surface of the first resin insulating layer 7 and in the first via throughhole 18, as shown by a bold line in the drawing, the first electroless plating layer 36 of about 0.7 $\mu$m thickness is formed (refer to FIG. 4).

Next, in the first electrolytic plating process, the electrolytic plating is conducted on this board 43, and as shown in FIG. 4, on the first electroless plating layer 36, the plating is formed until the first via throughhole 18 is completely filled by the plating. In this process, as the plating liquid, the plating liquid (the first plating liquid) in which, when the plating is conducted on a portion including the hole, the plating more grows inside the hole than outside the hole, is used. Thereby, the first via throughhole 18 is filled by the plating, and the first filled via 19 is formed, and on the first filled via 19 and the first electroless plating layer 36 of the surface of the first resin insulating layer 7, the first electrolytic plating layer 35 whose thickness is about 10 $\mu$m is formed.

In this connection, at the time of this process, different from the conventional one, because the plating resist layer is not formed on the board 43, depending on the difference of the easiness of collection of the leveling agent (plating inhibitor) in the plating liquid due to the existence of the plating resist layer, the thickness of the first electrolytic plating layer 35 is not changed depending on the position, or the spring-up does not exist in the first electrolytic layer 35. However, because, in the vicinity of the first filled via 19, the growth of the plating is easily dispersed, there is sometimes a case where the slight variation in the thickness is generated in the first electrolytic plating layer 35, for example, the first electrolytic plating layer 35 becomes partially slightly thick.

Figure 5:
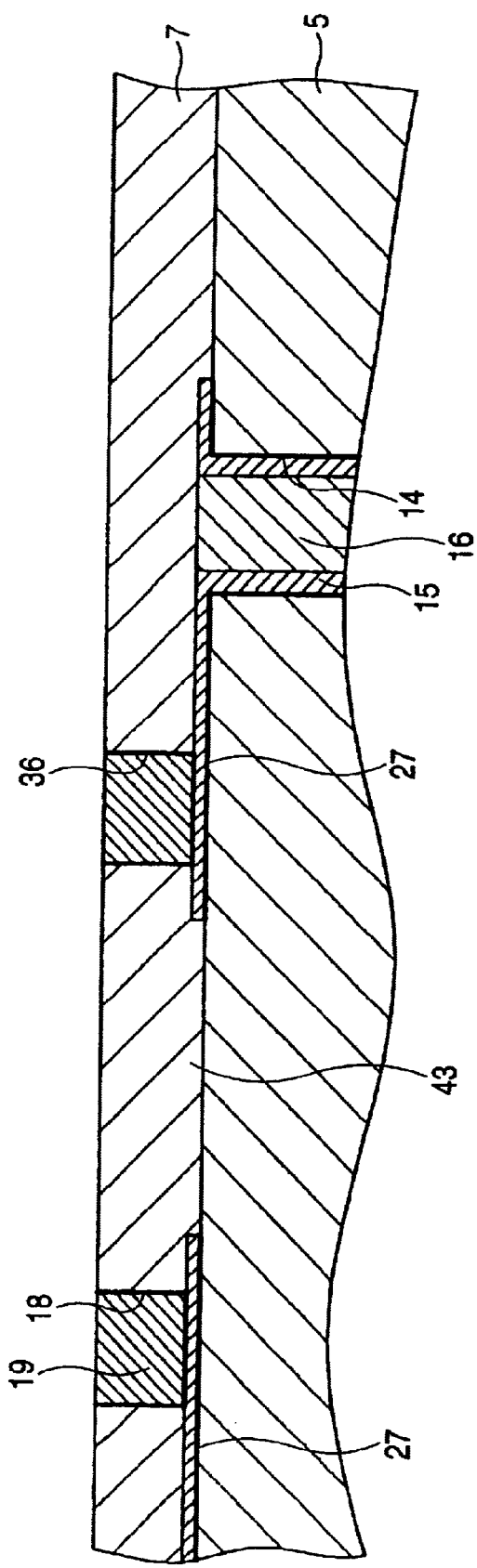
FIG. 5 relates to a method of producing the wiring board according to the embodiment 1, and is an illustration showing the condition of the board after the plating layer removal process.

Next, in the plating layer removal process, as shown in FIG. 5, the first electrolytic plating layer 35 and the first electroless plating layer 36 below it, (the first electroless plating layer 36 on the first resin insulating layer 7), are perfectly removed by etching. Thereby, because the first filled via remained as it is, on the board 43, the upper surface of the first filled via 19 is substantially equal to the surface of the first resin insulating layer 7. That is, the board surface becomes substantially flat.

Next, in the second electroless plating process, on the first resin insulating layer 7 and the first filled via 19, the electroless plating layer 33 of the about 0.7 $\mu$m thickness is formed. After that, in the plating resist layer forming process, the plating resist layer 41 of a predetermined pattern is formed on the second electroless plating layer 33 (refer to FIG. 6).

Figure 6:
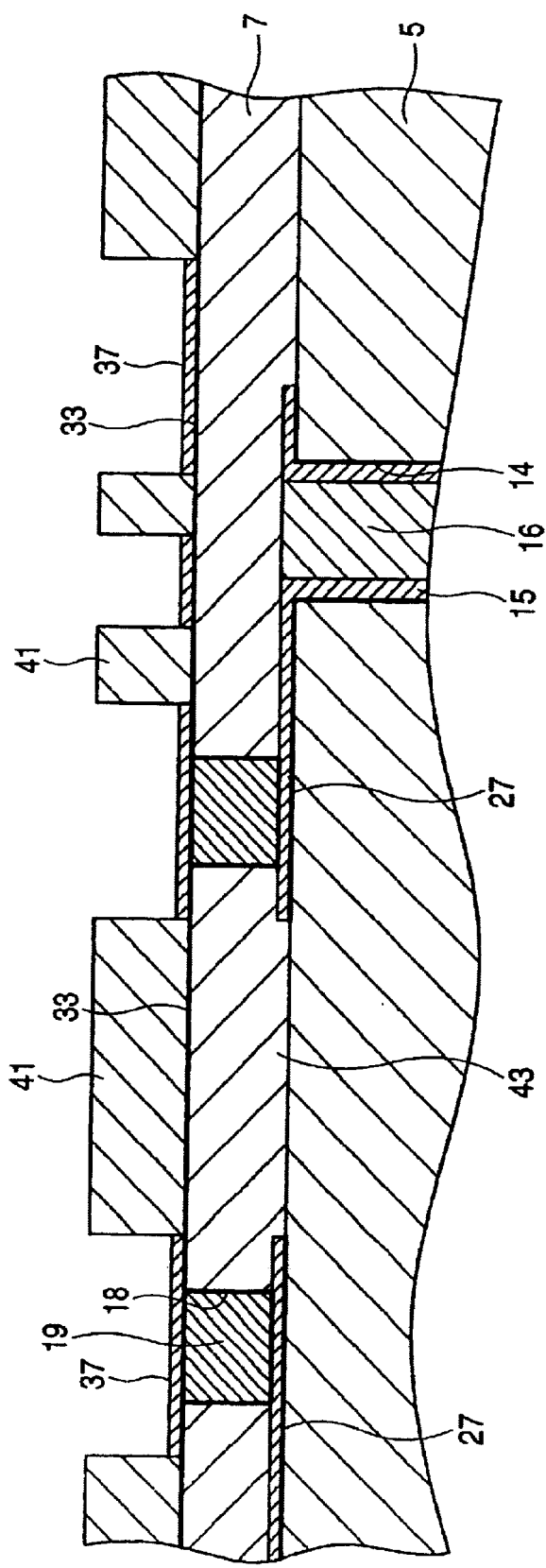
FIG. 6 relates to a method of producing the wiring board according to the embodiment 1, and is an illustration showing the condition of the board after the second electrolytic plating process.

Next, in the second electrolytic plating process, the electrolytic plating is conducted, and as shown in FIG. 6, the second electrolytic plating layer 37 is formed on the second electroless plating layer 33 exposed from the plating resist layer 41. At that case, as the plating liquid, different from the first electrolytic plating process, the conformal plating liquid (the second plating liquid) in which, when the plating is conducted on a portion including the hole, the plating grows in the same degree as inside the hole, or more grows than that on outside the hole, is used. In this process, the second electrolytic plating layer 37 with the thickness of about 20 $\mu$m is formed on the second electroless plating layer 33. Because this second electrolytic plating layer 37 is formed with substantially uniform thickness, even when the very thin second electroless plating layer 33 and the second electrolytic plating layer 37 are totaled, it becomes a substantially uniform thickness.

Next, in the second conductor layer forming process, the plating resist layer 41 is removed, and the second electroless plating layer 33 covered by the plating resist layer 41 is removed by etching, and the second conductor layer 29 of a predetermined pattern is formed (refer to FIG. 6 and FIG. 1–FIG. 3).

As described above, because the thickness in which the second electroless plating layer 33 and the second electrolytic plating layer 37 are totaled, are respectively substantially uniform, the second conductor layer 29 also has a substantially uniform thickness, and the appearance is good.

Next, in the roughening process, the surface of the second conductor layer 29 is etched and roughened, and its surface roughness Ra is made about 0.5 $\mu$m (refer to FIG. 2 and FIG. 3). In this case, in the vicinity of the surface of the second conductor layer 29, that is, in the second electrolytic plating layer 37, because the plating particle is about 1–2 $\mu$m and large, and uniform, the unevenness is hardly generated on the roughened surface, and the surface roughened by etching with the desired roughness and uniformity can be obtained.

Next, in the second insulating layer forming process, in the same manner as in the first resin insulating layer forming process, the second resin insulating layer 9 having the second via throughhole 22 is formed on the first resin insulating layer 7 and the second conductor layer 29 (refer to FIG. 1–FIG. 3). In that case, in the roughening process, in the surface of the second conductor layer 29, because the surface roughness is large and it is substantially uniform roughened surface, there is no unevenness in the close contact strength between the second conductor layer 29 and the second resin insulating layer 9, and the close contact strength is high.

After that, the second filled via 23 or the third conductor layer 31 is formed on the second resin insulating layer 9 according to the method to form the first filled via 19 or the second conductor layer 29 on the first resin insulating layer 7. That is, the resin roughening process, the first electroless plating process, the first electrolytic plating process, plating layer removal process, resin roughening process, the second electroless plating process, plating resist layer forming process, the second electrolytic plating process, the third conductor layer forming process, and the roughening process, are successively conducted.

After that, in the solder resist layer forming process, on the second resin insulating layer 9 and the third conductor layer 31, the solder resist layer 11 having the opening for pad 25 is formed. Specifically, on the second resin insulating layer 9 and the third conductor layer 31, the semi-hardened solder resist layer is formed, and by using the mask of a predetermined pattern corresponding to the opening for pad 25, it is exposed and developed. After that, it is heat treated and hardened, and solder resist layer 11 having the opening for pad 25 is formed.

As described above, because the second filled via 23 and the third conductor layer 31 are formed according to the forming method of the first filled via 19 or the second conductor layer 29, the same effect as them, can be obtained. Further, when the third conductor layer 31 is formed, because the second conductor layer 29 has substantially the uniform thickness and no convex spring-up, the insulation distance between the second conductor layer 29 and the third conductor layer 31 is sufficiently secured over the whole board. Accordingly, the electric failure such as the short circuit between upper and lower conductor layers, or the insulation failure is hardly generated.

After the solder resist layer 11 is formed, in Ni—Au plating process, on the pad 32 exposed from the solder resist layer 11, the Ni plating layer is formed for the oxidation prevention, and the Au plating layer is further formed thereon. As described above, the wiring board 1 is completed. In this connection, on the pad 32 exposed from the solder resist layer 11, a pin is studded by the soldering, or the solder bump may be formed.

(Embodiment 2)

Next, referring to the drawings, the second embodiment will be described. The structure of the wiring board of the present embodiment is the same as the wiring board 1 of the embodiment 1. However, in its production method, in the abode embodiment 1, after the plating layer removal process, although, by so-called semi-additive method, the second and third conductor layers 29 and 31 are formed, in the present embodiment, the different point is that, by so-called subtractive method, the second, third conductor layers 29 and 31 are formed. Because the other portion is the same as the embodiment 1, the description of the same portion is neglected or simplified.

In the present embodiment, the wiring board 1 is produced as follows. That is, in the same manner as in the embodiment 1, thee board 43 formed up to the first resin insulating layer 7 having the via throughhole 18 is prepared, and the resin roughening process, the first electroless plating process, the first electrolytic plating process, the plating layer removal process and the second electroless plating process, are successively conducted (refer to FIG. 4–FIG. 6).

Figure 7:
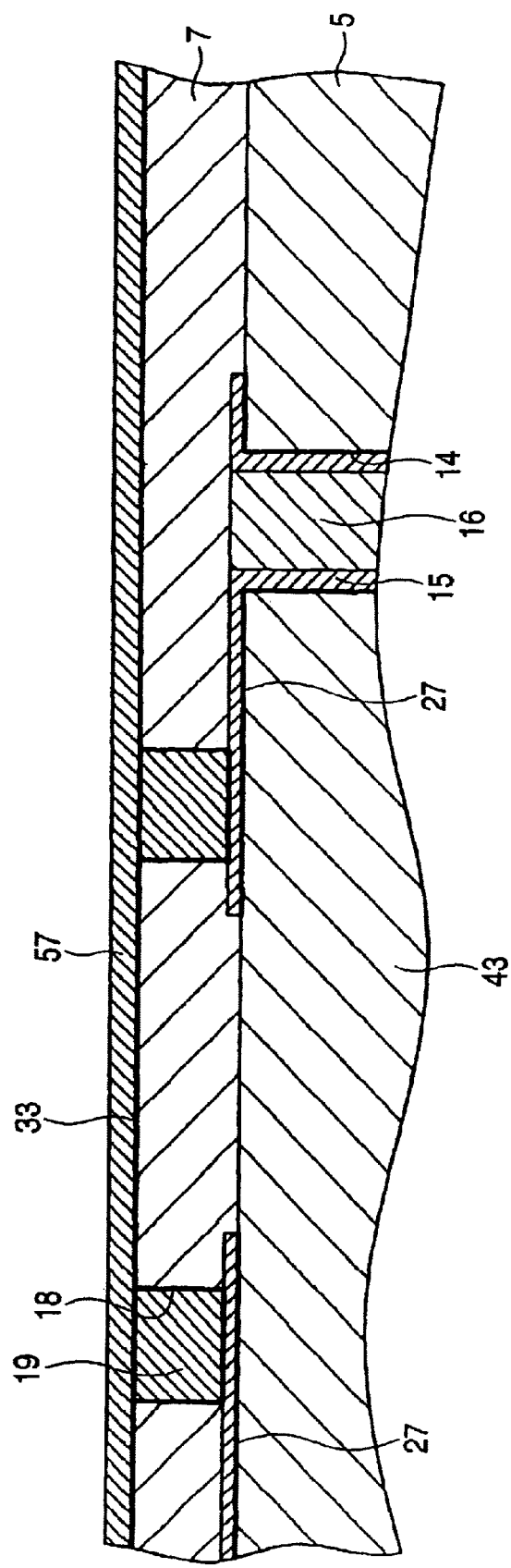
FIG. 7 relates to a method of producing the wiring board according to the embodiment 2 shown below, and is an illustration showing the condition of the board after the second electrolytic plating process.

Next, different from the embodiment 1, the plating resist layer is not formed, and the second electrolytic plating process is conducted. That is, as shown in FIG. 7, the electrolytic plating is conducted on the board 43 in which the second electroless plating layer 33 shown by the bold line in the drawing, is exposed over whole surface, and the second electrolytic plating layer 57 of about 20 μm thickness is formed on substantially whole surface.

In this connection, as the plating liquid, in the same manner as in the embodiment 1, the conformal plating liquid (the second plating liquid) is used. Accordingly, in the second electrolytic plating layer 57, in the same manner as in embodiment 1, the thickness is substantially uniform.

Figure 8:
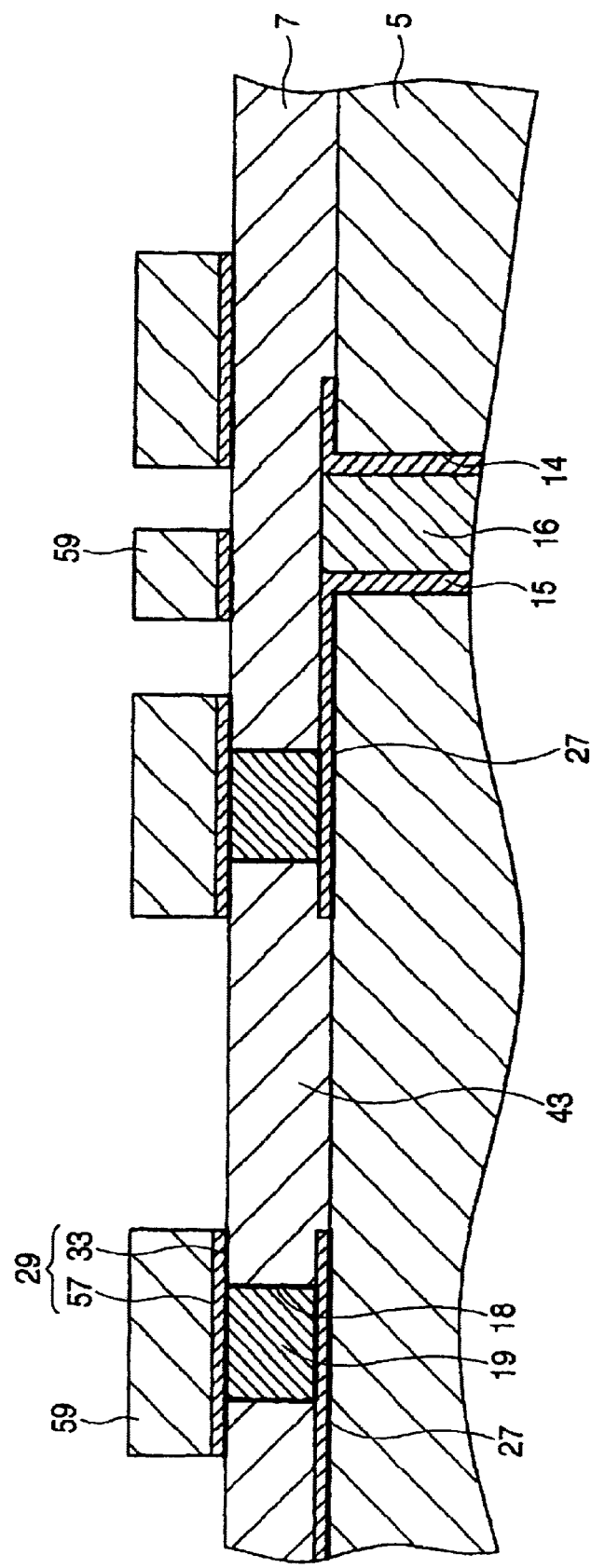
FIG. 8 relates to a method of producing the wiring board according to the embodiment 2, and is an illustration showing the condition of the board on which the second conductor layer is formed.
Figure 9:
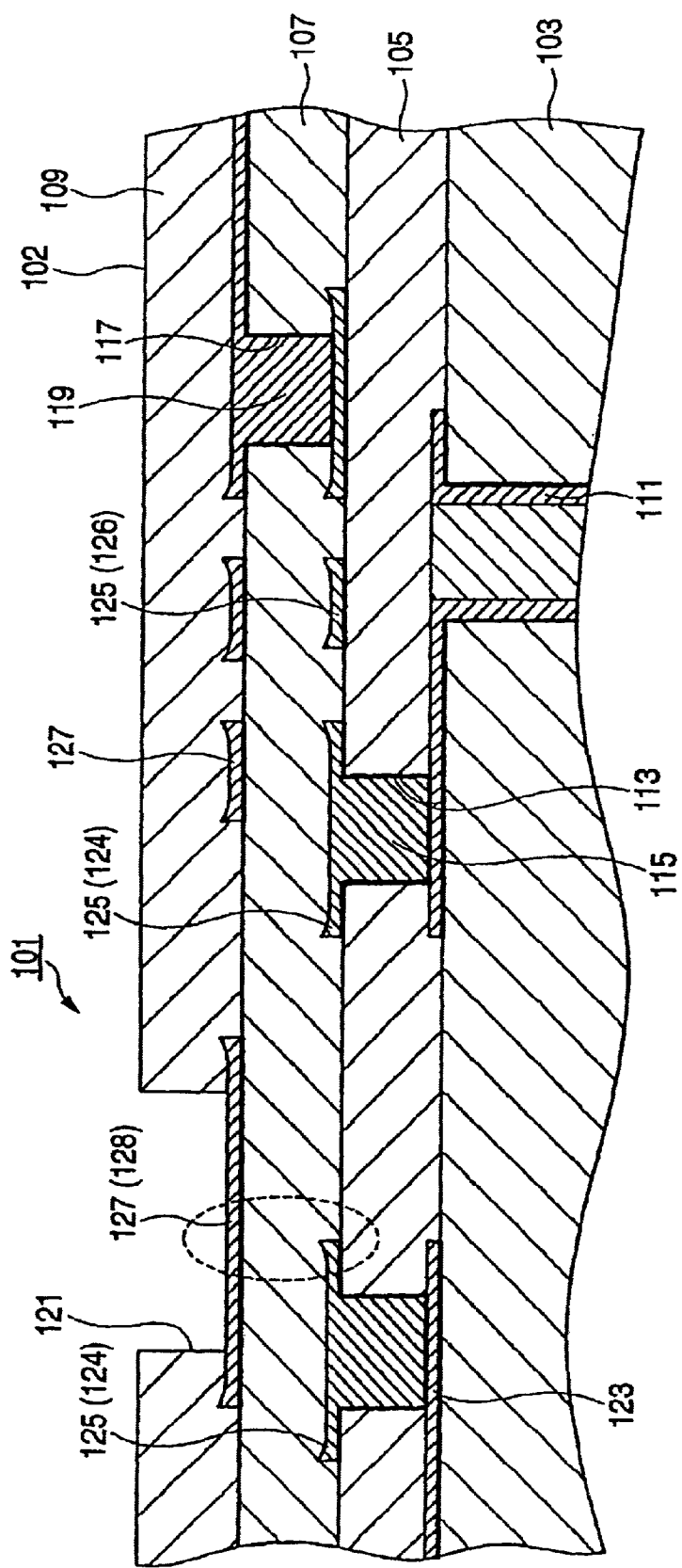
FIG. 9 is a partial enlarged sectional view of the wiring board according to the conventional technology.
Figure 10:
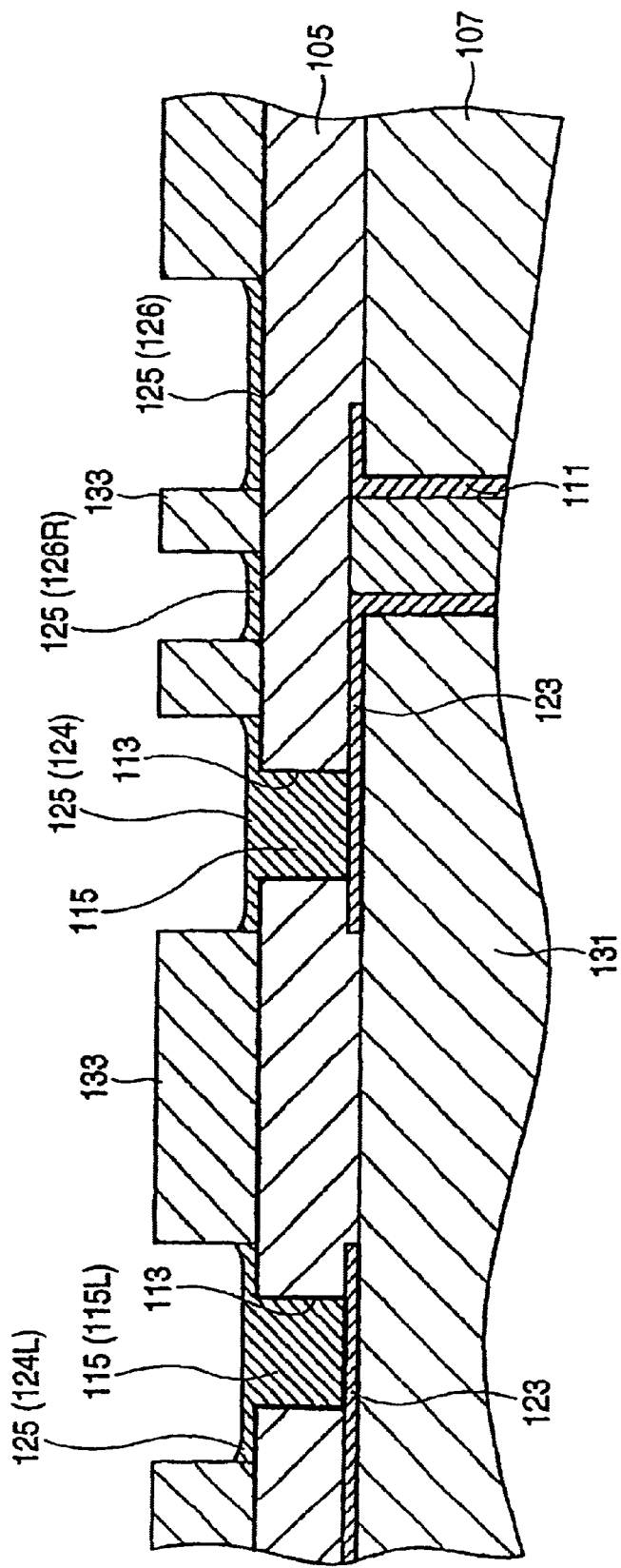
FIG. 10 relates to a method of producing the wiring board according to the conventional technology, and is an illustration showing the condition on which the filled via and the electrolytic plating layer are formed.

Next, in the etching resist layer forming process, the etching resist layer 59 of a predetermined pattern is formed on the second electrolytic plating layer 57 (refer to FIG. 8).

After that, in the second conductor layer forming process, as shown in FIG. 8, the second electrolytic plating layer 57 exposed from the etching resist layer 59 and the second electroless plating layer 33 below it, are removed by etching. Thereby, the second conductor layer 29 of a predetermined pattern is formed, after that, the etching resist layer 59 is removed. As described above, in the second electrolytic plating layer 57, because the thickness is substantially uniform, the second conductor layer 29 including the very thin electroless plating layer 33, in the same manner as in the embodiment 1, has substantially uniform thickness, and its appearance becomes good.

After that, the process of the embodiment 1 or the present embodiment is conducted, and the wiring board 1 is produced. That is, in the same manner as in the embodiment 1, the roughening process, the second resin insulating layer forming process, resin roughening process, the first electroless plating process, the first electrolytic plating process, plating layer removal process, and the second electroless plating process, are conducted.

After that, as described in the present embodiment, the second electrolytic plating process, etching resist layer forming process, and the third conductor layer forming process are successively conducted, and the third conductor layer 31 is formed. Next, in the same manner as in the embodiment 1, the roughening process, solder resist forming process, and Ni—Au plating process, are conducted, then, the wiring board 1 is completed. In this connection, although the description is neglected in the present embodiment, because the structure of the wiring board 1 of the present embodiment is the same as the embodiment 1, the same effect as the embodiment 1 can be obtained. Further, also in the production method, as for the same process as the embodiment 1, the same effect as the embodiment 1 can be obtained.

In the above description, although the present invention is described according to each embodiment, the present invention is not limited to each of embodiments 1 and 2, but, it is needless to say that, within the scope not departing from its spirit, it may be appropriately varied and applied.

For example, in each of embodiments 1 and 2, when the second conductor layer 29 is formed, in the plating removal process, although the first electrolytic plating layer 35 and the first electroless plating layer 36 are removed by etching, these plating layers may be physically removed by the mechanical grinding. Even when the plating layer is removed in this manner, in the same manner as in each of the embodiments 1 and 2, the first filled via 19 is remained, and the board surface can be made substantially flat. However, by the mechanical grinding, because, not only the plating layer, but the surface of the first resin insulating layer 7 is also ground, its surface roughness is decreased. Accordingly, it is preferable that, after the plating layer removal process, before the second electroless plating process, the resin roughening process is conducted again, and the surface of the first resin insulating layer 7 is etched and roughened. In this connection, the same thing can also be said for the formation of the third conductor layer 31.

Further, in each of embodiments 1 and 2, after the plating layer removal process, by using so-called semi-additive method or subtractive method, the second and the third conductor layers 29 and 31 are formed. In contrast to this, for example, by so-called full-additive method, the second and the third conductor layers 29 and 31 can be formed. That is, in the same manner as in each of embodiments 1 and 2, the board 4 formed up to the first resin insulating layer 7 is prepared, and the first electroless plating process, the first electrolytic plating process, the plating layer removal process, and the resin roughening process, are successively conducted.

After that, the second electroless plating layer is not formed, and in the plating resist layer forming process, the plating resist layer of a predetermined pattern is directly formed on the first resin insulating layer 7. Then, in the plating process, the plating layer (the second conductor layer) is formed on the first resin insulating layer 7 exposed from this plating resist layer. After that, the plating resist layer is removed, and in the same manner as in each of embodiments 1 and 2, the roughening process may be conducted. In such the method, even when the second and third conductor layers 29 and 31 are formed, the same effect as in each of embodiments 1 and 2, for example, the thickness of these conductor layers is substantially uniform, and the appearance becomes good, can be obtained.

This application is based on Japanese patent application JP 2000-323887, filed Oct. 24, 2000, the entire content of which is hereby incorporated by reference, the same as if set forth at length.

What is claimed is:

1. A method of producing a wiring board comprising: a resin insulating layer having a through hole penetrating the resin insulating layer; a filled via which is filled and formed by plating in the through hole; and a conductor layer formed by plating on the filled via and at least a portion of the resin insulating layer, which comprises:
    a first electrolytic plating step of subjecting a board which includes the resin insulating layer having the through hole and a first electroless plating layer formed in the through hole and on the outside of the through hole, to electrolytic plating on the first electroless plating layer with a first plating liquid by which the electrolytic plating is grown more rapidly in the inside of the through hole than on the outside of the through hole when the plating is carried out on a portion of the board including the through hole, so as to form the filled via in the through hole by plating and form a first electrolytic plating layer on the filled via and on substantially the entire surface of the first electroless plating layer of the resin insulating layer on the outside of the through hole; and
    a plating layer removal step of removing the first electrolytic plating layer and the first electroless plating layer on the outside of the through hole.

2. A method of producing the wiring board according to claim 1, wherein the plating layer removal step is carried out by mechanically grinding the first electroless plating layer on the resin insulating layer, and the first electrolytic plating layer, and the production method further comprises, after the mechanical grinding, a resin roughening step of roughening a surface of the resin insulating layer where the first electrolytic and the first electroless plating layers are removed, by etching.

3. A method of producing the wiring board according to claim 1, which further comprises:
    an electroless plating step of forming a second electroless plating layer on the filled via where the first electrolytic plating layer is removed and on a substantially entire surface of the resin insulating layer; and
    a second electrolytic plating step of subjecting a portion exposed to the outside in the second electroless plating layer, to electrolytic plating with a second plating liquid, so as to form a second electrolytic plating layer to be the conductor layer.

4. A method of producing the wiring board according to claim 2, which further comprises:
    an electroless plating step of forming a second electroless plating layer on the filled via where the first electrolytic plating layer is removed and on a substantially entire surface of the resin insulating layer; and
    a second electrolytic plating step of subjecting a portion exposed to the outside in the second electroless plating layer, to electrolytic plating with a second plating liquid, so as to form a second electrolytic plating layer to be the conductor layer.

5. A method of producing the wiring board according to claim 3, which further comprises:
    a second roughening step of roughening a surface of the conductor layer by etching to form a roughened second conductor layer, after the second electrolytic plating step; and
    an upper resin insulating layer forming step of forming an upper resin insulating layer on the roughened conductor layer and on the resin insulating layer.

6. A method of producing the wiring board according to claim 4, which further comprises:
    a second roughening step of roughening a surface of the conductor layer by etching to form a roughened second conductor layer, after the second electrolytic plating step; and
    an upper resin insulating layer forming step of forming an upper resin insulating layer on the roughened conductor layer and on the resin insulating layer.

7. A method of producing the wiring board according to claim 5, wherein the second electrolytic plating layer formed in the second electrolytic plating step comprises plating particles having a size not smaller than about 1 µm.

8. A method of producing the wiring board according to claim 6, wherein the second electrolytic plating layer formed in the second electrolytic plating step comprises plating particles having a size not smaller than about 1 µm.

9. A method of producing the wiring board according to claim 5, which further comprises an upper conductor layer forming step of forming an upper conductor layer on the upper resin insulating layer.

10. A method of producing the wiring board according to claim 6, which further comprises an upper conductor layer forming step of forming an upper conductor layer on the upper resin insulating layer.

11. A method of producing the wiring board according to claim 7, which further comprises an upper conductor layer forming step of forming an upper conductor layer on the upper resin insulating layer.

12. A method of producing the wiring board according to claim 8, which further comprises an upper conductor layer forming step of forming an upper conductor layer on the upper resin insulating layer.

13. A method of producing a wiring board comprising:
    subjecting a board, which includes a resin insulating layer having a through hole and a first electroless plating layer formed in the through hole and on the outside of the through hole, to electrolytic plating on the first electroless plating layer, such that the electrolytic plating forms a filled via in the through hole and forms a first electrolytic plating layer on the filled via and on the surface of the first electroless plating layer; and
    completely removing the first electrolytic plating layer and the first electroless plating layer on the outside of the through hole.

* * * * *